United States Patent
Hamilton

[15] 3,679,961
[45] July 25, 1972

[54] BUFFER AMPLIFIER AND VOLTAGE REGULATING CIRCUIT

[72] Inventor: David C. Hamilton, Midland Park, N.J.
[73] Assignee: Ramsey Controls, Inc., Mahwah, N.J.

[22] Filed: July 7, 1971
[21] Appl. No.: 160,392

[52] U.S. Cl. ....................................323/8, 323/17, 323/19, 323/9
[51] Int. Cl. ....................................................G05f 3/08
[58] Field of Search ...........................323/8, 9, 17, 19, 22 T

[56] References Cited

UNITED STATES PATENTS 3,246,233 4/1966 Herz....................................323/22 T
3,416,067 12/1968 Hoke, Jr. ................................323/17
3,536,988 10/1970 Boynton ..................................323/9

*Primary Examiner*—A. D. Pellinen
*Attorney*—Kenyon & Kenyon Reilly Carr & Chapin

[57] ABSTRACT

A circuit for providing a D.C. voltage output equal to the D.C. voltage input regardless of the output load while giving current amplification. An emitter follower circuit in conjunction with an output diode is utilized to regulate the output voltage. The circuit also protects against overload and short circuit conditions, as well as suppressing spurious oscillations.

8 Claims, 1 Drawing Figure

PATENTED JUL 25 1972
3,679,961
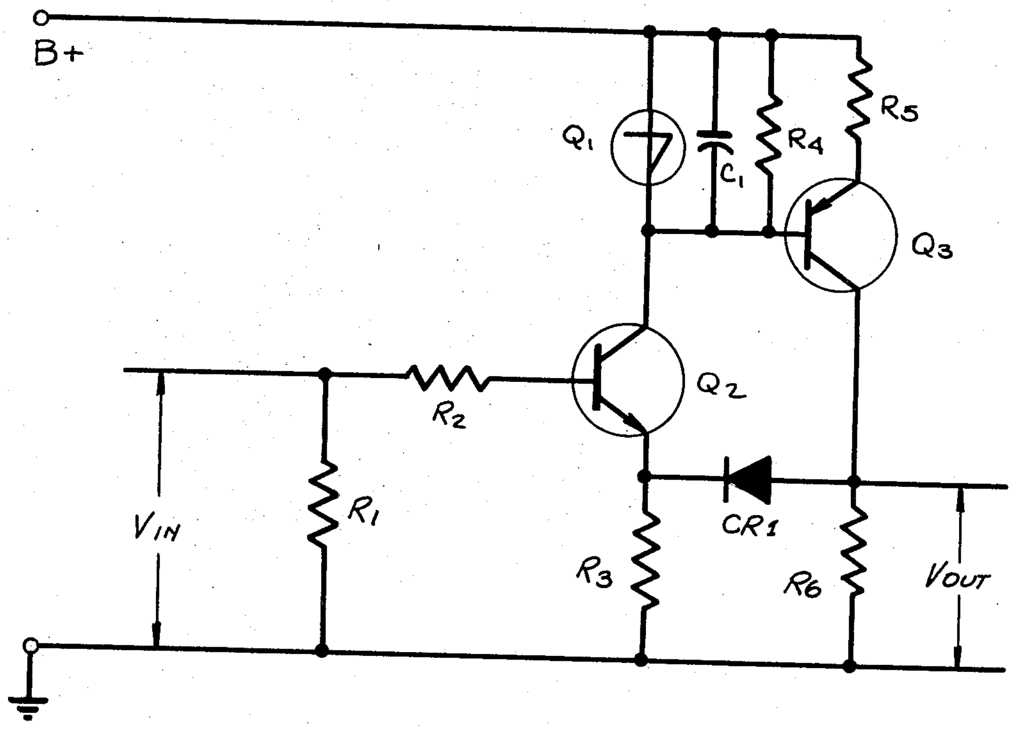
INVENTOR.
DAVID C. HAMILTON
BY
Kenyon & Kenyon Reilly Carr & Chapin
ATTORNEYS

BUFFER AMPLIFIER AND VOLTAGE REGULATING CIRCUIT

BACKGROUND OF THE INVENTION

In many applications, such as lighting controls, where a single variable D.C. voltage source controls a plurality of output loads connected in parallel, it has been the common practice to connect a buffer amplifier between the D.C. voltage source and the loads. For example, in theatrical lighting, a buffer amplifier has been connected between a control source, such as a potentiometer, and the parallel connected bank of dimmers. Such a buffer amplifier, in order to function effectively, must have a voltage transfer ratio of 1, extremely sensitive load regulation, low drift due to temperature, no susceptibility to parasitic oscillations and protection against short circuiting. Prior art buffer amplifiers have been deficient in one or more of the above-stated essential requirements and have therefore been unsuited to most applications, particularly those where great reliability is required.

SUMMARY OF THE INVENTION

It is therefore an object of the invention to provide a new and improved buffer amplifier.

A further object of the invention is to provide an improved buffer amplifier which regulates the output voltage to be equal to the input voltage regardless of the magnitude of the load.

A still further object of this invention is to provide such a buffer amplifier circuit which is effective, even after prolonged shorting of its output.

Still another object of this invention is to provide a buffer amplifier circuit which is not susceptible to parasitic oscillations.

These and other objects of the invention are achieved through a circuit including a transistor emitter follower amplifier having a current regulating diode connected in the emitter circuit of the transistor. Short circuit protection is provided by a solid state switch which turns off the amplifier in case of overload or short circuit conditions. A high band filter circuit reduces high band gain and thus suppresses oscillations by slowing down the response time of the feedback between the current regulating diode and the emitter follower.

DESCRIPTION OF DRAWINGS

The single FIG. of drawing is a schematic diagram showing the improved buffer amplifier voltage regulating circuit according to the present invention.

DETAILED DESCRIPTION OF THE INVENTION

Referring now to the FIG. of drawing, there is illustrated schematically the buffer amplifier and voltage regulator circuit according to the present invention. As illustrated, NPN transistor Q2 is connected as an emitter follower in circuit with resistors R1 and R3. The variable input voltage Vin; which may be taken from a potentiometer for example, is impressed across resistor R1, while the B+supply voltage may preferably comprise an unregulated, filtered D.C. source.

The output voltage is taken across resistor R6 which is connected in parallel with resistor R3, diode CR1 being connected between the upper terminals of the two resistors. Resistor R6 is also connected in series with the emitter collector circuit of PNP transistor Q3.

Resistor R5 is connected between the B+voltage supply and the emitter of transistor Q3 and silicon unilateral switch (SUS) Q1 is connected in parallel with the series combination of resistor R5 and the emitter base circuit of transistor Q5. Q1 and R5 as will be more fully explained below, provide the necessary overload and short circuit protection.

Resistor R2 connected between the upper terminal of resistor R1 and the base of transistor Q2, resistor R4 and capacitor C1 both connected in parallel across SUS Q1 and in series with the emitter collector circuit of transistor Q2, and resistor R6 are chosen so as to slow down the response of the circuit and reduce the gain in the high frequency band so as to eliminate the possibility of unwanted oscillations.

In operation, when an input voltage Vin is impressed across resistor R1, emitter follower transistor Q2 begins to conduct and the voltage across resistor R3 becomes equal to 0.5 volts below the input voltage Vin, due to the drop across the PN junction in transistor Q2. The conduction of transistor Q2 also causes transistor Q3 to conduct, producing an output current through resistor R6. As the current through R6 increases, the voltage drop across R6 also increases. At the time when the voltage drop becomes 0.5 volts greater than the voltage drop across R3 (0.5 volts being the inherent voltage drop across the PN junction of diode CR1) CR1 will be forward biased and will conduct. The conduction of diode CR1 will cause the output current to flow through diode CR1 and resistor R3, raising the voltage drop across R3. This rise in voltage across resistor R3 will reverse bias transistor Q2 and reduce the output current flow until the voltage across R6 becomes equal to 0.5 volts above the voltage drop across R3. At this point diode CR1 will no longer be forward biased and the output current will flow only through resistor R6. In this way, the output voltage across R6 is regulated to 0.5 volts above the voltage above R3. Since, as stated above, the voltage across R3 is 0.5 volts below the input voltage Vin, the output voltage across R6 is regulated to be equal to the input voltage despite increases in output currents. Such changes in load current may be occasioned in lighting applications for example by increasing the number of dimmers connected in parallel with the output resistor R6.

As stated above, overload and short circuit protection are provided by resistor R5 and SUS Q1. SUS Q1 is a device of the type which is switched on any time the voltage on its anode goes above a predetermined reference point and stays on until the voltage is removed. Thus, since the voltage across the resistor R5 is proportional to output current, Q1 will turn on when the current through R5 increases beyond a predetermined limit. Q1 will remain in the conductive condition with a 1 -volt drop across it until power is removed. Thus, the voltage across R5 will be clamped at approximately 1 volt, thus limiting the output current to a value well below its rating.

The size and ratings of the various circuit components are dictated by output current requirements. It should be realized however, that the circuit described hereinabove can be manufactured quite inexpensively since exact matching of the characteristics of diode CR1 and transistor Q2 are not required for most applications, so long as the voltage drops across the two PN junctions are each approximately equal to 0.5 volts. Temperature drift may be minimized by thermally connecting CR1 and Q2.

While the invention has been described with specific reference to the circuit shown and described above, it should be realized that various modifications may be made therein without departing from the spirit and scope of the invention as defined in the claims appended below.

I claim:

1. In a current amplifier having a D.C. voltage input and a D.C. voltage output, improved means for regulating said output voltage to be equal to said input voltage, comprising:

a. first transistor means;

b. means for applying said input voltage to said first transistor means so as to cause it to conduct;

c. first resistance means connected to said first transistor means having a voltage drop equal to said input voltage less the voltage drop through a PN junction of said first transistor means;

d. second resistance means;

e. means for causing current flow through said second resistance means when said first transistor means conducts; and f. diode means connected between said first resistance means and said second resistance means for modifying said current flow, so that the voltage drop across said second resistance means is equal to said input voltage.

2. The combination set forth in claim 1 wherein said first transistor means is connected as an emitter follower.

3. The combination set forth in claim 2 wherein said means for causing current flow comprises a second transistor means, the base of which is connected to the collector of said first transistor means.

4. The combination set forth in claim 3 wherein said second resistance means is connected to the collector of said second transistor means and to the anode of said diode means.

5. The combination set forth in claim 1 further including means for suppressing parasitic oscillations.

6. The combination set forth in claim 5 wherein said suppressing means comprises resistance and capacitance means for slowing down the rate at which said current flow is modified.

7. The combination set forth in claim 1 further including means for protecting against excessive load currents through said second resistance means.

8. The combination set forth in claim 7 wherein said protecting means comprises resistance means connected in series with the emitter base circuit of said second transistor means and unilateral switching means connected in parallel with said series connected resistance and emitter-base circuit.

* * * * *